United States Patent [19]
Smith et al.

[11] Patent Number: 6,043,710
[45] Date of Patent: Mar. 28, 2000

[54] LOW-VOLTAGE AMPLIFIERS

[75] Inventors: Jeffrey M.H Smith; Colin L Perry, both of Swindon, United Kingdom

[73] Assignee: Mitel Semiconductor Limited, United Kingdom

[21] Appl. No.: 09/185,837

[22] Filed: Nov. 4, 1998

[30] Foreign Application Priority Data

Nov. 14, 1997 [GB] United Kingdom ............... 9724136
Jul. 24, 1998 [GB] United Kingdom ............... 9816128

[51] Int. Cl.[7] .............................. H03F 3/45; G06F 7/44
[52] U.S. Cl. ............................................. 330/254; 327/359
[58] Field of Search .................................. 330/252, 254, 330/257; 327/359

[56] References Cited

U.S. PATENT DOCUMENTS 5,250,911  10/1993  Linder et al. ......................... 330/252
5,365,192  11/1994  Wagner et al. ....................... 330/252
5,825,231  10/1998  Chevallier et al. ................... 327/356
5,826,182  10/1998  Gilbert ................................. 327/359

FOREIGN PATENT DOCUMENTS 0 131 337 A1  1/1985  European Pat. Off. .
2 279 527     1/1995  United Kingdom .

*Primary Examiner*—Robert Pascal
*Assistant Examiner*—Patricia T. Nguyen
*Attorney, Agent, or Firm*—Kirschstein, et al.

[57] ABSTRACT

An amplifier comprises a common-base transistor 1 and a common-emitter transistor 2. The transistor 1 is arranged to receive an input signal applied to an input terminal 8 by an inductor 12 connected to its emitter. The transistor 2 is arranged to receive the input signal by a capacitor 13 connected to its base electrode. The transistors 1 and 2 are biased by a current mirror arrangement comprising a transistor 3 and a current source 16. Differential current output signals are provided on the collectors of the transistors 1 and 2.

18 Claims, 2 Drawing Sheets

LOW-VOLTAGE AMPLIFIERS

FIELD OF THE INVENTION

The present invention relates to low-voltage amplifiers, and in particular although not exclusively to low-voltage amplifiers for use in radiotelephones.

BACKGROUND OF THE INVENTION

The demands for large-signal handling capability in radiotelephones and in particular cellular phone circuits such as low-noise amplifiers and mixers are increasing, while the supply voltages on which they are required to operate are decreasing. For example, a few years ago battery voltages of 4.8 volts were common, whereas today cellular phone circuits may be required to operate from a 2.7 volt supply.

The lower supply voltage can make it difficult to design large-signal handling circuits around standard integrated circuit mixer configurations, such as Gilbert cells, which usually require a number of active devices to be stacked between the supply rails in order to be current efficient. These active devices may include, for example, the transistors of an input amplifier by means of which unbalanced or single-ended radio frequency received signals are amplified and phase-split to provide the balanced or differential current signals required to drive the transistors of a mixer cell.

DESCRIPTION OF THE PRIOR ART

EP-A-0584870 shows at FIG. 2 thereof a transconductance amplifier comprising a common base transistor and a common emitter transistor arranged to receive a single-ended input signal and to provide differential current signals at their collector electrodes. However, this amplifier is not a low-voltage amplifier, and the present invention seeks to provide a low-voltage amplifier having improved or comparable transfer characteristics yet operable at lower voltages than this prior art amplifier.

SUMMARY OF THE INVENTION

According to a first aspect of the present invention there is provided a low-voltage amplifier for providing differential current outputs from a single-ended input comprising a first transistor connected to receive signals from said input in common-base configuration by an impedance, a second transistor connected to receive signals from said input in a common-emitter configuration by a capacitor, and means to forward bias the base-emitter junctions of said first and second transistors, the differential outputs being derived from the collector electrodes of said first and second transistors.

The capacitor acts as a dc block which therefore allows the base voltage of the common-base connected transistor to be independent of the base voltage of the common-emitter connected transistor. This allows more voltage headroom above the amplifier and can provide improved linearity and gain over prior art common-base/common emitter transistor amplifiers.

The means to forward bias the base-emitter junctions of the first and second transistors may comprise a third transistor connected in a current-mirror configuration.

According to a second aspect of the present invention there is provided a low-voltage amplifier for selectively providing differential current output signals from one or more of at least two amplifier stages in response to signals applied to a single-ended input common to the amplifier stages, each amplifier stage comprising a first transistor connected to receive signals from the input in a common-base configuration and a second transistor arranged to receive signals from the input in a common-emitter configuration, the emitter electrodes of at least two of said first transistors connected by a common first inductor to the input and the base electrodes of at least two of said second transistors connected by a common second inductor to a negative voltage supply line, the differential outputs of an amplifier stage being derived from the collector electrodes of the first and second transistors of that stage.

BRIEF DESCRIPTION OF THE DRAWINGS

Embodiments of the present invention will now be described by way of example only with reference to the accompanying drawings of.

DETAILED DESCRIPTION OF THE PREFERRED EMBODIMENT

Figure 1:
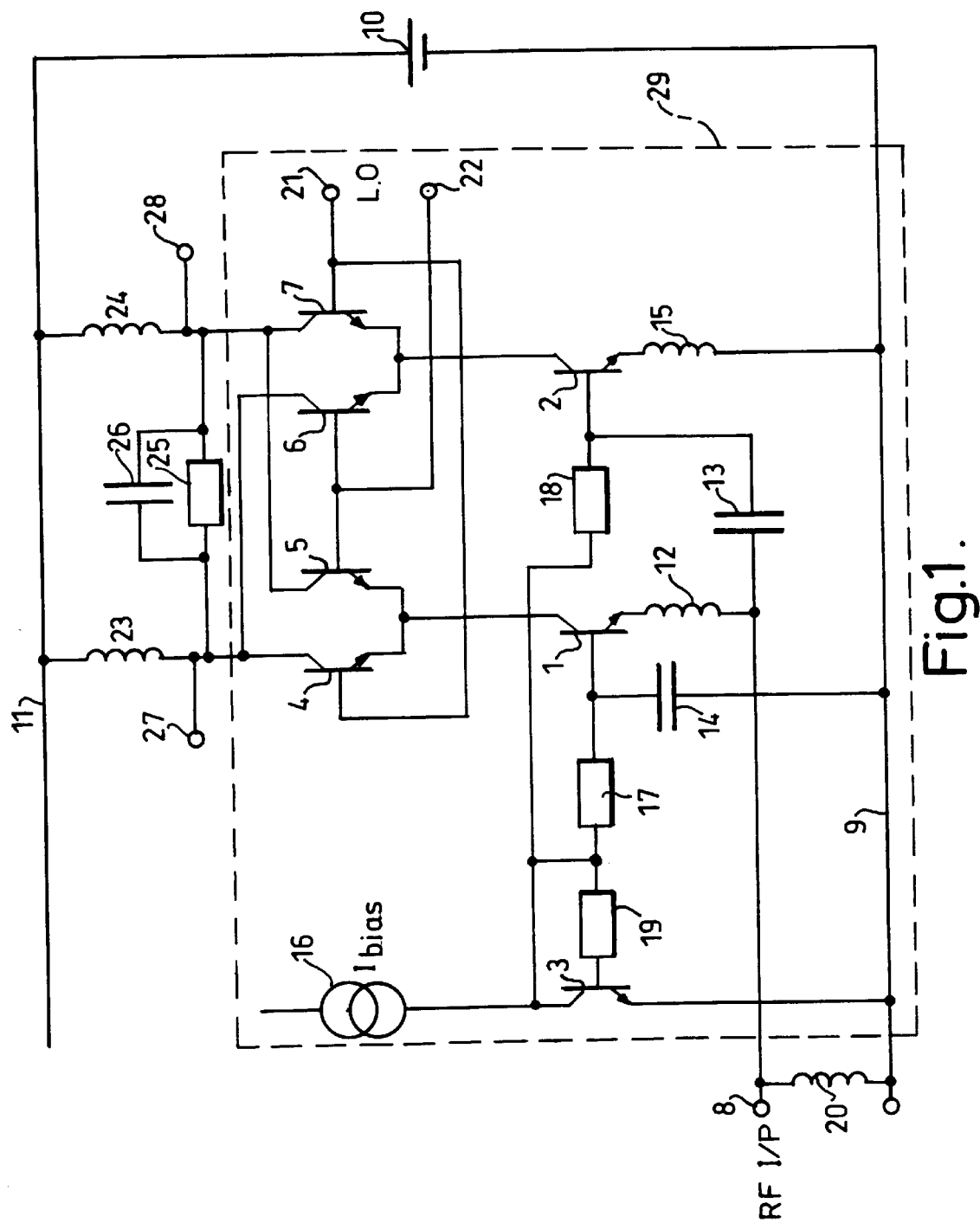
FIG. 1 shows a low-voltage amplifier in accordance with the first aspect of the present invention.

Referring to FIG. 1, a low-voltage amplifier, comprising first, second and third transistors 1, 2 and 3, forms the input stage for a mixer stage comprising transistors 4, 5, 6 and 7. A radio frequency input signal is arranged to be applied between an input terminal 8 and a common negative supply line or rail 9. A battery 10 providing, for example, 2.7 volts, may be connected between the line 9 and a positive supply line 11.

The input terminal 8 is connected by way of a first inductor 12 to the emitter electrode of the first transistor 1 and by way of a first capacitor 13 to the base electrode of the second transistor 2, radio-frequency return paths to the line 9 being completed by way of a second capacitor 14 from the base electrode of the first transistor 1 and by way of a second inductor 15 from the emitter electrode of the second transistor 2.

Direct-current bias for the first and second transistors 1 and 2 is provided by biasing means comprising a current-mirror arrangement formed by a current source 16 and a third transistor 3, with first, second and third biasing resistors 17, 18 and 19 connecting the collector circuit of the third transistor 3 to the base electrodes respectively of the first and second transistors 1 and 2 and the third transistor 3. The values of these resistors may be chosen to set the required values of current flow through the first and second transistors 1 and 2, compensating for their finite current gains. The second resistor 18 also provides a measure of radio frequency isolation of the bias arrangement from the radio frequency signals at the base electrode of the second transistor 2, while the first capacitor 13 provides a DC block to the bias at the base electrode of the second transistor 2. A direct current path to the line 9 for the emitter current of the first transistor 1 is provided by way of an inductor or rf choke 20 between the input terminal 8 and the line 9, the reactance of this choke 20 being accounted for in the design of the matching network normally provided at the input terminal 8.

It will be seen that for radio frequency signals the first transistor 1 is connected in common-base configuration while the second transistor 2 is connected in common-emitter configuration, so that in response to radio frequency signals at the input terminal 8, differential current signals are provided from the collector electrodes of the first and second transistors 1 and 2 to drive the mixer stage transistors 4 and 5 and 6 and 7 respectively. These differential current signals are mixed in operation with local oscillator signals applied at terminals 21 and 22, and intermediate frequency output signals from the cross-coupled collector electrodes of the mixer transistors 4 to 7 are applied to a load circuit comprising load inductors 23 and 24 and a filter circuit comprising a resistor 25 and a capacitor 26. Differential output voltage signals at intermediate frequency may be taken from first and second output terminals 27 and 28.

The first and second inductors 12 and 15 provide a measure of inductive degeneration, although this is not essential to the operation of the amplifier. For biasing purposes the inductors 12, 15 and 20 may be considered as very close to DC short circuit. The biasing means 3, 16, 14, 15, 12 enables the first and second transistors 1 and 2 to have their emitter electrodes very close to the potential of the line 9, thus maximizing the proportion of the supply voltage which remains available to the rest of the circuit, that is, the mixer stage and the load circuit, where the largest voltage swings are to be expected.

The amplifier and mixer described above may be formed on an integrated circuit chip, indicated by the dashed outline 29, the choke 20 and the components 23 to 26 of the load circuit being provided externally, as shown, or on-chip.

Figure 2:
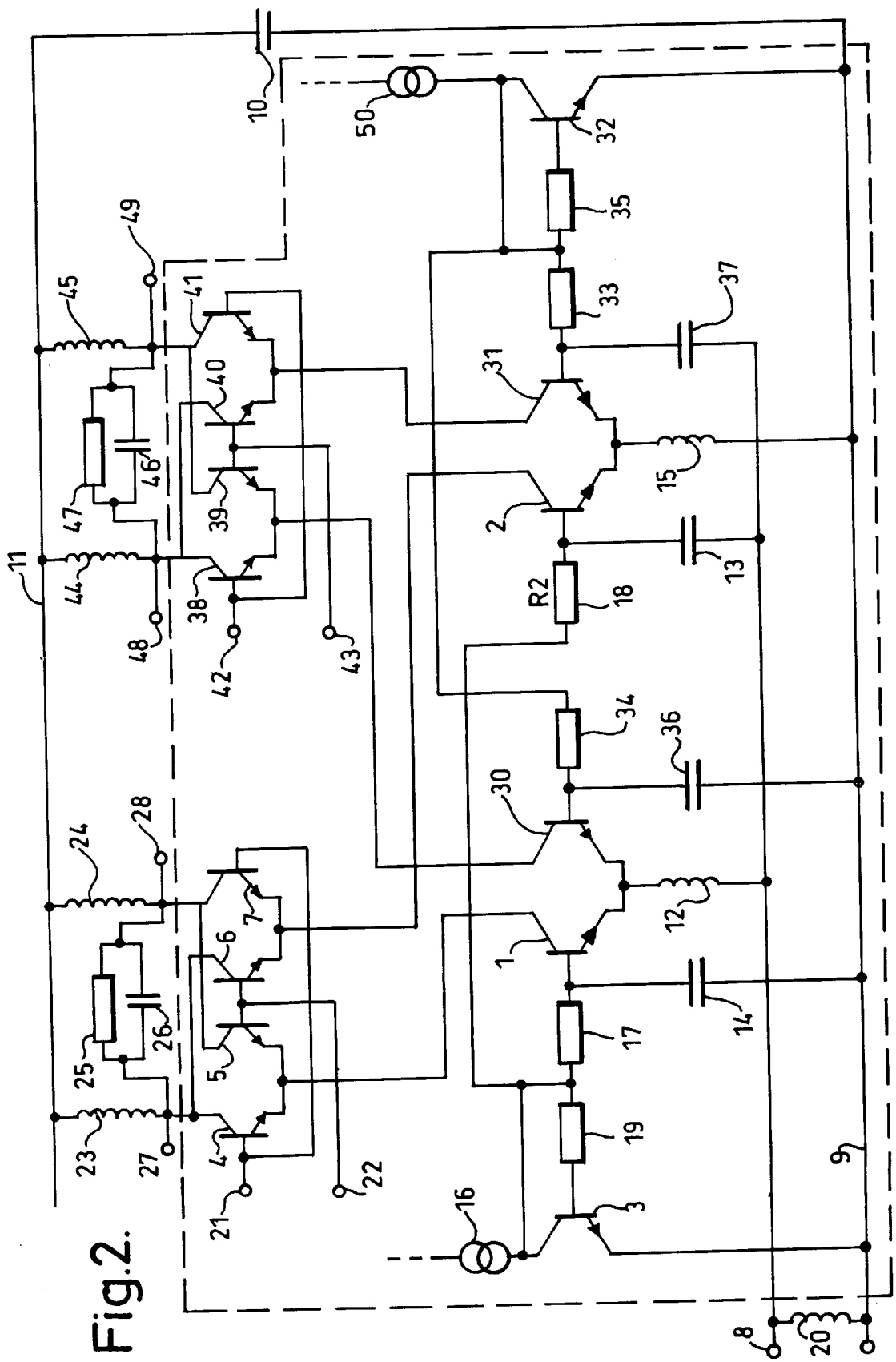
FIG. 2 shows a low-voltage amplifier in accordance with the first and second aspects of the present invention.

Although only a preferred feature of the present invention, the inductors 12 and 15 can each take up a large area on the integrated circuit on which they are formed. The inventors have found that these inductors can be used also by one or more further amplifier circuits formed on the same integrated circuit. FIG. 2 shows a low-voltage amplifier having two amplifying circuits.

Referring to FIG. 2, a first amplifier stage comprises the amplifier of FIG. 1, from which reference numerals have been re-used for like elements. The first amplifier stage is connected to a mixer core formed from transistors 4 to 7, as in FIG. 1. A second amplifier stage is formed from fourth, fifth and sixth transistors 30, 31 and 32, each biased by their respective one of biasing resistors 34, 33 and 35. The base of the fourth transistor 30 is connected to the negative supply line 9 by a third capacitor 36 and the base of the fifth transistor 31 is connected to the input terminal 8 by a fourth capacitor 37. The emitter of the fourth transistor 30 is connected to the input terminal 8 by the first inductor 12, which it thereby shares with the first transistor 1. The fifth transistor 31 similarly shares the second inductor 15 with the second transistor 2.

The collector electrodes of the fourth and fifth transistors 30 and 31 form respective ones of differential current inputs to a second mixer core formed by transistors 38, 39, 40 and 41. The second mixer core is arranged to receive local oscillator signals on local oscillator input terminals 42 and 43. A load circuit formed by load inductors 44 and 45 and a filter circuit formed by a capacitor 46 and a resistor 47 are connected between the output of the second mixer core and the positive supply line 11 and third and fourth output terminals 48 and 49 are provided in much the same way as the load and filter circuit arrangement of the first mixer core formed by the components 23 to 28.

The first amplifier stage is selected to handle signals applied to the input terminal 8 by switching on the current source 16 with the use of external control circuitry (not shown). The second amplifier stage can similarly be selected for handling the signal applied to the input terminal 8 by selection of its current source 50, by the same or similar external control circuitry (not shown). Whichever of the first and second amplifier stages is selected, its performance will not be compromised by the connection of the first and second transistors 1 and 2 or the fourth and fifth transistors 30 and 31 as the case may be because of the high emitter impedance of these transistors.

It is contemplated that the FIG. 2 low-voltage amplifier arrangement will be of particular use in applications where the use of a variable frequency local oscillator is impractical, expensive or otherwise undesirable. The FIG. 2 arrangement can allow two, different fixed frequency local oscillator signals to be mixed with a single input RF signal using the circuitry formed on single integrated circuit. It is possible even to select both the first and the second amplifier stages at the same time, providing output signals on the terminals 27 and 28 and the terminals 48 and 49 simultaneously. Such output signals would of course be derived from the same input signal, but would be dependent on the local oscillator signals applied to their respective local oscillator input terminals 21, 22 and 42, 43.

If only one of the first and second amplifier stages is to be selected at any one time, further component reuse could be obtained by the connection of the collector electrodes of the transistors 4 and 38 together and the connection of the collector electrodes of the transistors 7 and 41 together, a single load circuit and a single filter circuit then being needed to provide intermediate frequency output signals from the selected one of the mixer cores.

With the FIG. 2 arrangement, it is possible to provide easily the first amplifier stage with a different gain to that of the second amplifier stage. Although this could be achieved by the fabrication of the fourth and fifth transistors 30 and 31 with different properties to those of the first and second transistors 1 and 2, the first and second inductors 12 and 15 could be connected in the following way to achieve the same effect. If, for example, the first and second transistors 1 and 2 are connected to the outermost end of a respective five turn inductor 12 and 15 and the input terminal 8 and the negative supply line 9 are connected respectively to the innermost ends of the inductors 12 and 15, the second amplifier stage could be provided with a higher gain by connecting the fourth and fifth transistors 30 and 31 to the fourth or to the third turn of the inductors 12 and 15.

It will be appreciated by the skilled person that further amplifier stages, and further mixer cores and load circuits if necessary, can be connected to the input terminal 8 in the same way as the second amplifier stage. Each further amplifier stage would require its own voltage biasing means, preferably a current source connected in a current mirror configuration as in the first and second amplifier stages shown in FIG. 2. These further amplifier stages could share the inductors 12 and 15, or could involve separate inductors.

We claim:

1. A low-voltage amplifier for providing differential current outputs from a single-ended input comprising: a first transistor connected to receive signals from said input in a common-base configuration via an impedance; a second transistor connected to receive signals from said input in a common-emitter configuration via a capacitor; and a circuit to forward bias base-emitter junctions of said first and second transistors, the second transistor having an emitter electrode connected to ground potential via a first component having a DC impedance which is low compared to its AC impedance, and the input being connected to ground potential via a second component having a DC impedance which is low compared to its AC impedance.

2. A low-voltage amplifier in accordance with claim 1 in which the impedance comprises an inductor.

3. A low-voltage amplifier in accordance with claim 1 in which the first component comprises an inductor.

4. A low-voltage amplifier in accordance with claim 1 in which the second component comprises an inductor.

5. A low-voltage amplifier in accordance with claim 1 wherein the circuit comprises a third transistor connected in a current-mirror configuration.

6. A low-voltage amplifier in accordance with claim 2 wherein the circuit comprises a third transistor connected in a current-mirror configuration.

7. A low-voltage amplifier in accordance with claim 3 wherein the circuit comprises a third transistor connected in a current-mirror configuration.

8. A low-voltage amplifier in accordance with claim 4 wherein the circuit comprises a third transistor connected in a current-mirror configuration.

9. A low-voltage amplifier for selectively providing differential current output signals from one or more of at least two amplifier stages in response to signals applied to a single-ended input common to the amplifier stages, each amplifier stage comprising a first transistor connected to receive signals from the input in a common-base configuration and a second transistor arranged to receive signals from the input in a common-emitter configuration, the emitter electrodes of at least two of said first transistors connected by a common first inductor to the input and the base electrodes of at least two of said second transistors connected by a common second inductor to a negative voltage supply line, the differential outputs of an amplifier stage being derived from the collector electrodes of the first and second transistors of that stage.

10. A low-voltage amplifier in accordance with claim 9 in which at least one of said second transistors is connected to receive the signals from the input by a capacitor.

11. A low-voltage amplifier in accordance with claim 9 further comprising a bias circuit associated with each amplifier stage, each bias circuit selectable to forward bias the base emitter junctions of the first and second transistors of its associated amplifier stage.

12. A low-voltage amplifier in accordance with claim 10 further comprising a bias circuit associated with each amplifier stage, each bias circuit selectable to forward bias the base emitter junctions of the first and second transistors of its associated amplifier stage.

13. A low-voltage amplifier in accordance with claim 11 which each bias circuit comprises a third transistor connected in a current-mirror configuration.

14. A low-voltage amplifier in accordance with claim 12 which each bias circuit comprises a third transistor connected in a current-mirror configuration.

15. A mixer circuit arrangement including a low-voltage amplifier in accordance with claim 1.

16. A mixer circuit arrangement including a low voltage amplifier in accordance with claim 9.

17. A radiotelephone including a mixer circuit arrangement in accordance with claim 15.

18. A radiotelephone including a mixer circuit arrangement in accordance with claim 16.

* * * * *